(12) United States Patent
Chen et al.

(10) Patent No.: US 11,329,209 B1
(45) Date of Patent: May 10, 2022

(54) HIGH TEMPERATURE OPTOELECTRONIC DEVICES FOR POWER ELECTRONICS

(71) Applicants: Zhong Chen, Fayetteville, AR (US); Shui-Qing Yu, Fayetteville, AR (US); H. Alan Mantooth, Fayetteville, AR (US); Andrea Wallace, Fayetteville, AR (US); Syam Madhusoodhanan, Fayetteville, AR (US)

(72) Inventors: Zhong Chen, Fayetteville, AR (US); Shui-Qing Yu, Fayetteville, AR (US); H. Alan Mantooth, Fayetteville, AR (US); Andrea Wallace, Fayetteville, AR (US); Syam Madhusoodhanan, Fayetteville, AR (US)

(*) Notice: Subject to any disclaimer, the term of this patent is extended or adjusted under 35 U.S.C. 154(b) by 112 days.

(21) Appl. No.: 16/717,065

(22) Filed: Dec. 17, 2019

Related U.S. Application Data

(60) Provisional application No. 62/780,640, filed on Dec. 17, 2018.

(51) Int. Cl.
*H01L 33/64* (2010.01)
*H01L 33/00* (2010.01)

(52) U.S. Cl.
CPC .......... *H01L 33/641* (2013.01); *H01L 33/007* (2013.01); *H01L 33/642* (2013.01)

(58) Field of Classification Search
None
See application file for complete search history.

(56) References Cited

U.S. PATENT DOCUMENTS

2013/0181208 A1* 7/2013 Guo ............... H01L 31/125
257/40

OTHER PUBLICATIONS

"Low temperature co-fired ceramics (LTCC) microsystems" by Golonka et al. (Year: 2011).*
"Mart packaging of electronics and integrated MEMS devices using LTCC" by Kumar et al. (Year: 2009).*
"Research on LTCC-based Flat Optocoupler Assembly Technology" (Year: 2018).*
"Research on LTCC-based Flat Optocoupler Assembly Technology" by Jun. (Year: 2018).*
P. Neudeck, R. Okojie and Liang-Yu Chen, "High-temperture electronics—a role for wide bandgap semiconductors?", Proceedings of the IEEE, vol. 90, No. 6, pp. 1065-1076, 2002.
N. Hwang, P. Naidu, and A. Trigg, "Failure analysis of plastic packaged optocoupler light emitting diodes," Proceedings of the 5th Electronics Packaging Technology Conference (EPTC 2003).
"Optocouplers for Hartlepool," Electronics and Power, vol. 29, No. 4, p. 287, 1983.
J.-S. Wang, C.-C. Tsai, J.-S. Liou, W.-C. Cheng, S.-Y. Huang, G.-H. Chang, and W.-H. Cheng, "Mean-time-to-failure evaluations of encapsulation materials for LED package in accelerated thermal tests," Microelectronics Reliability, vol. 52, No. 5, pp. 813-817, 2012.
R. Joshi, C.-L. Wu, and M. Narayanan, "Optocoupler BGA package," 52nd Electronic Components and Technology Conference 2002. (Cat. No. 02CH37345).

(Continued)

*Primary Examiner* — Evren Seven
(74) *Attorney, Agent, or Firm* — Keisling & Pieper PLC; David B. Pieper; Trent C. Keisling

(57) ABSTRACT

A high temperature optoelectronic isolator for power electronics operating above 250 degrees Celcius.

4 Claims, 12 Drawing Sheets

(56) References Cited

OTHER PUBLICATIONS

M. Usui, S. Ishibashi, H. Hirata, S. Ishizawa, N. Koshoubu, T. Hayashi, and S. Ohki, "Opto-Electronic Chip-on-Film Packaging Technology Using Low-CTE Fluorinated Polyimide Optical Waveguide Films," IEEE Transactions on Components, Packaging and Manufacturing Technology, vol. 4, No. 10, pp. 1582-1588, 2014.

R. Khazaka, L. Mendizabal, D. Henry, and R. Hanna, "Survey of High-Temperature Reliability of Power Electronics Packaging Components," IEEE Transactions on Power Electronics, vol. 30, No. 5, pp. 2456-2464, 2015.

N. Pararelli, J. S. Lee, C. Scarcella, S. Zhou, P. Ossieur, P. A. O'Brien, "Optical and Electronic Packaging Process for Silicon Photonic Systems," Journal of Lightwave Technology, vol. 33, No. 5, pp. 991-997, 2015.

H. Wu, S. He, X. Chen, G. Xu, D. Lei, "Failure Mechanisms and Package Reliability Issues in Optocouplers," 17th International Conference on Electronic Reliability Technology, 2016.

Y. Yao, Z. Chen, G. Lu, D. Boroyevich, K. D. T. Ngo, "Characterization of Encapsulants for High-Voltage High-Temperature Power Electronic Packaging," IEEE Transactions on Components, Packaging and Manufacturing Technology, vol. 2, No. 4, 2012.

\* cited by examiner

HIGH TEMPERATURE OPTOELECTRONIC DEVICES FOR POWER ELECTRONICS

STATEMENT REGARDING FEDERALLY SPONSORED RESEARCH OR DEVELOPMENT

This invention was made with government support by the U.S. Department of Energy Office of Science Contract No. DE-SC0016485. The government has certain rights in the invention.

CROSS-REFERENCE TO RELATED APPLICATIONS

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in electrical components. More particularly, the invention relates to improvements particularly suited for power modules. In particular, the present invention relates specifically to a low temperature co-fired ceramic, LTCC, process to house the bare die components of the optoelectronic devices such as light emitters and photodetectors.

2. Description of the Known Art

As will be appreciated by those skilled in the art, power modules and optoelectronic devices are known in various forms.

The conventional power modules require a comprehensive thermal management system, which inevitably adds weight and cost. High temperature high density power modules will not only enhance reliability but also substantially reduce cooling requirements. The total system cost and weight are significantly decreased. Many applications, such as electric vehicle, space transportation, aviation, deep oil and gas exploration, can benefit from the development of high temperature power modules. High density power modules become possible with the integration of wide bandgap semiconductor power devices due to their unique characteristics such as high temperature operating capability.

In order to enable the entire power modules to operate in the harsh environment, the high temperature operating capability is not only needed for power devices, but also for gate driver circuits, which includes a galvanic isolation system. A reliable galvanic isolation system is always required in power modules to protect circuit, system and people from electric shocks and short circuit conditions. The isolation systems need to pass through the gate control signal, reject the transient noise and break the ground loops. Three most commonly used galvanic isolation systems (isolation transformers, capacitive couplers and optocouplers) are compared in Table 1.

TABLE 1

Galvanic Isolation Solutions

| Galvanic Isolations | Isolation Transformers | Capacitive Couplers | Optocouplers |
|---|---|---|---|
| Couplings | Magnetic | Capacitive | Optical |
| Size and weight | Bulky, heavy | Small, light | Small, light |
| Signal modulating | Needed | Needed | Not needed |
| Waveform droop | Yes | Yes | No |
| Common mode noise immunity | Low | Medium | High |
| Response time | High | Medium | Medium |
| Isolation voltage | High | Medium | High |
| EMI and ESD tolerance | Average | Good | Excellent |

Isolation transformers are typically used in high density power modules due to the high voltage and high power isolation requirement, as shown in FIG. 1. To address this, one promising solution is to replace isolation transformers with optocouplers. The optocoupler uses light waves to provide high voltage and transient noise isolation. The advantages of using optocouplers include but are not limited to significant reduction in size, higher voltage isolation, superior electromagnetic interference EMI immunity, excellent electrostatic discharge ESD performance and increased flexibility in 3D package integration.

However, regular semiconductor optoelectronic materials and devices have significant difficulty functioning in the harsh environments designated for SiC-based power module usage such as operation at high temperatures. For comparison, accelerated aging lifetime testing for light emitting diodes LEDs is normally conducted up to 150° C. and devices fail after a few thousands of hours, while a SiC-based power module working in next generation electrical vehicles are expected to survive at 250° C. for at least ten years. Ultimately, it is not the intrinsic properties of SiC devices that prevent their use at higher temperatures, but rather the low voltage electronics needed to drive them and the packaging that surrounds them. The typical operating temperature for optocouplers is up to 100° C., due to the limitations of LED devices inside and packaging materials of the optocouplers. The significant decrease of performance over time at high temperatures become the main reason to integrate optocouplers in high density power modules. The degradation of LEDs in the optocouplers at high temperatures is the major problem, which limits the operating temperature range of optocouplers.

References for consideration include:

[1] P. Neudeck, R. Okojie and Liang-Yu Chen, "High-temperature electronics—a role for wide bandgap semiconductors?", Proceedings of the IEEE, vol. 90, no. 6, pp. 1065-1076, 2002.
[2] N. Hwang, P. Naidu, and A. Trigg, "Failure analysis of plastic packaged optocoupler light emitting diodes," Proceedings of the 5th Electronics Packaging Technology Conference (EPTC 2003).

[3] "Optocouplers for Hartlepool," Electronics and Power, vol. 29, no. 4, p. 287, 1983.

[4] J.-S. Wang, C.-C. Tsai, J.-S. Liou, W.-C. Cheng, S.-Y. Huang, G.-H. Chang, and W.-H. Cheng, "Mean-time-to-failure evaluations of encapsulation materials for LED package in accelerated thermal tests," Microelectronics Reliability, vol. 52, no. 5, pp. 813-817, 2012.

[5] R. Joshi, C.-L. Wu, and M. Narayanan, "Optocoupler BGA package," 52nd Electronic Components and Technology Conference 2002. (Cat. No. 02CH37345).

[6] M. Usui, S. Ishibashi, H. Hirata, S. Ishizawa, N. Koshoubu, T. Hayashi, and S. Ohki, "Opto-Electronic Chip-on-Film Packaging Technology Using Low-CTE Fluorinated Polyimide Optical Waveguide Films," IEEE Transactions on Components, Packaging and Manufacturing Technology, vol. 4, no. 10, pp. 1582-1588, 2014.

[7] R. Khazaka, L. Mendizabal, D. Henry, and R. Hanna, "Survey of High-Temperature Reliability of Power Electronics Packaging Components," IEEE Transactions on Power Electronics, vol. 30, no. 5, pp. 2456-2464, 2015.

[8] N. Pararelli, J. S. Lee, C. Scarcella, S. Zhou, P. Ossieur, P. A. O'Brien, "Optical and Electronic Packaging Process for Silicon Photonic Systems," Journal of Lightwave Technology, vol. 33, no. 5, pp. 991-997, 2015.

[9] H. Wu, S. He, X. Chen, G. Xu, D. Lei, "Failure Mechanisms and Package Reliability Issues in Optocouplers," 17th International Conference on Electronic Reliability Technology, 2016.

[10] Y. Yao, Z. Chen, G. Lu, D. Boroyevich, K. D. T. Ngo, "Characterization of Encapsulants for High-Voltage High-Temperature Power Electronic Packaging," IEEE Transactions on Components, Packaging and Manufacturing Technology, vol. 2, no. 4, 2012.

From these prior references it may be seen that this prior art is very limited in its utilization, and an improved high temperature optoelectronic device is needed to overcome these limitations.

SUMMARY OF THE INVENTION

The present invention is directed to an improved high temperature optoelectronic device. In accordance with one exemplary embodiment of the present invention, a high temperature optoelectronic device is provided using a low temperature co-fired ceramic substrate.

This invention claims a novel packaging technique and a packaged optocoupler device that can operate at high temperature over 250° C., expected temperature for operation is 300° C., for gate drive application. High temperature characterization of the bare die components allowed the realization of device functionality at high temperatures. Reliability concerns of optocouplers are well known in literature, especially in extreme environments. To guarantee operation temperatures upwards of 300° C., the novel optocoupler device has been packaged using a high temperature substrate material that allows for miniaturization and easy integration of the device.

The present invention is useful in high density power modules, DC and AC power control, PC communications, signal isolation, power supply regulation, microprocessor input/output switching Advantages of the present invention include Higher operating temperatures compared with conventional optocouplers, increase in power density due to decrease in size of power module, provide electrical isolation for various applications superior electromagnetic interference EMI immunity at high temperature, excellent electrostatic discharge ESD performance and increased flexibility in 3D package integration.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
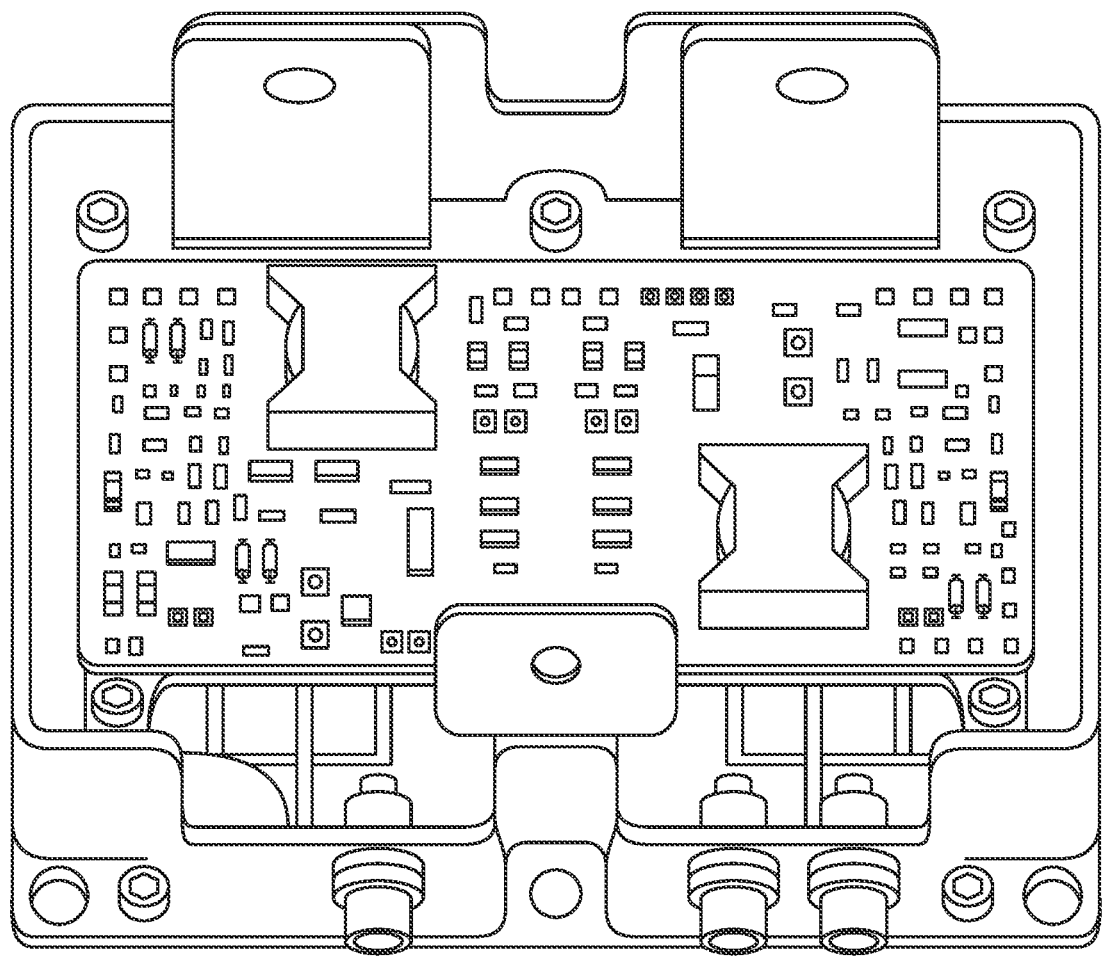
FIG. 1 shows the 2009 R&D 100 award winning 50 kVA SiC-based vehicular drive module fabricated at UA in collaboration with APEI, Rohm, and Sandia National Labs.

As described using FIGS. 1-8 of the drawings, one exemplary embodiment of the present invention is generally shown as an optoelectronics isolator. High temperature optoelectronics have a huge impact on emerging power electronics applications, for example electric vehicles, power grid, rail transportation, energy storage, and renewable energy. High-density power modules are the core of the above-mentioned power electronic applications. High-density power modules based on wide band gap devices can safely operate at temperature of up to 250° C. [1]. Integrating optoelectronic device to a high density power module is therefore challenging. Commercially available optocouplers are rated for 125° C., with a few exceptions. As the demand for high temperature electronics increases, this device will soon become a limitation to enabling high temperature power modules and electronics. The reliability concerns of these devices is widely known in literature and most issues arise from extreme environments (elevated temperatures, humidity, corrosion, etc.) as well as the intrinsic properties of the device (efficiency droop, fabrication defects/contaminations, etc.). The packaging of this device has many considerations due to the variety of reliability concerns. This invention provides a novel packaging technique for an optocoupler device to enable high temperature operation as well as supporting the demand in increasing power density. This invention demonstrates the method of designs and fabrications of high temperature optocouplers and their implementation into 3D high density power modules.

In order to reliably operate an optocoupler at high temperatures (>250° C.), LEDs and detectors with high temperature operating (>350° C.) and long lifetime (>10 years) is desired. It is difficult to study the different degradation mechanisms, such as injected current level, non-radiative recombination, active region doping, interface of active region or substrate, ohmic contact, packaging materials, etc., in the LED devices using standard accelerated lifetime measurements. A systematic characterization methodology was developed to analyze the performance, lifetime and reliability of LED devices and distinguish multiple failure mechanisms up to 550° C. With the understandings of different degradation or failure mechanisms at high temperatures, high reliable LED devices can be designed to operate at harsh environment with extended lifetime. Group III-nitride materials are potential candidates for high temperature applications due to the wide range of bandgap, which can also be adjusted with material compositions. The materials could be a binary alloy such as, gallium-nitride, or ternary alloys such as, aluminum-gallium-nitride (AlGaN) and indium-gallium-nitride (InGaN). Ultraviolet (UV) and deep UV LEDs, photodetectors, and other optoelectronic devices have fabricated because the bandgap of material (e.g., AlGaN) can be tuned between 3.34 to 6 eV by changing the Al composition in the alloy. Another example is aluminum-nitride (AlN), which has a direct bandgap of 6 eV, is favorable for deep UV-LEDs. In addition to the bandgap property, they have high mechanical hardness, high thermal conductivity, large dielectric constant, and high resistance to harsh environment. A good progress has been made on development group III-nitride materials to fabricate devices, which can be operate at high temperatures.

Proof of the Concept:

High temperature characterization has been performed on a variety of bare die LEDs and photodetectors. This testing has provided the information needed to reliably determine the functionality of these bare components at elevated temperatures. The data reported demonstrates these devices are capable of working up to 300° C. The intrinsic properties of LTCC allow operation at high temperatures, up to 500° C. This is one of the key properties for our device to operate at high temperature.

Several nitride-based commercial LED materials were purchased for the evaluations of materials at high temperatures up to 550° C. The material-level characterizations are consisting of three parts—high temperature photoluminescence (PL) measurement, high temperature IV measurement and high temperature electroluminescence (EL) measurement. Through analyzing the material properties at high temperatures, we can understand the key parameters of LED materials such as spontaneous quantum efficiency at different injection level, radiative coefficiency, SRH (non-radiative) recombination coefficiency. The high temperature IV measurements provide the forward and reverse characteristics of the LED and photodetector devices. The turn-on voltage and leakage current can be obtained at high temperatures, which affects the performance of the optocouplers. The EL measurements will provide detailed information on the LED devices without packaging at high temperatures. High temperature characterization of materials and devices were conducted using a Janis ST-100 cryostat. A Horiba 550 spectrometer is used to measure the PL & EL spectra. A Keithley 2450 source measurement unit was used for the current-voltage measurements at different temperatures. A monochromator was used to characterize photo detectors at high temperature.

Figure 2:
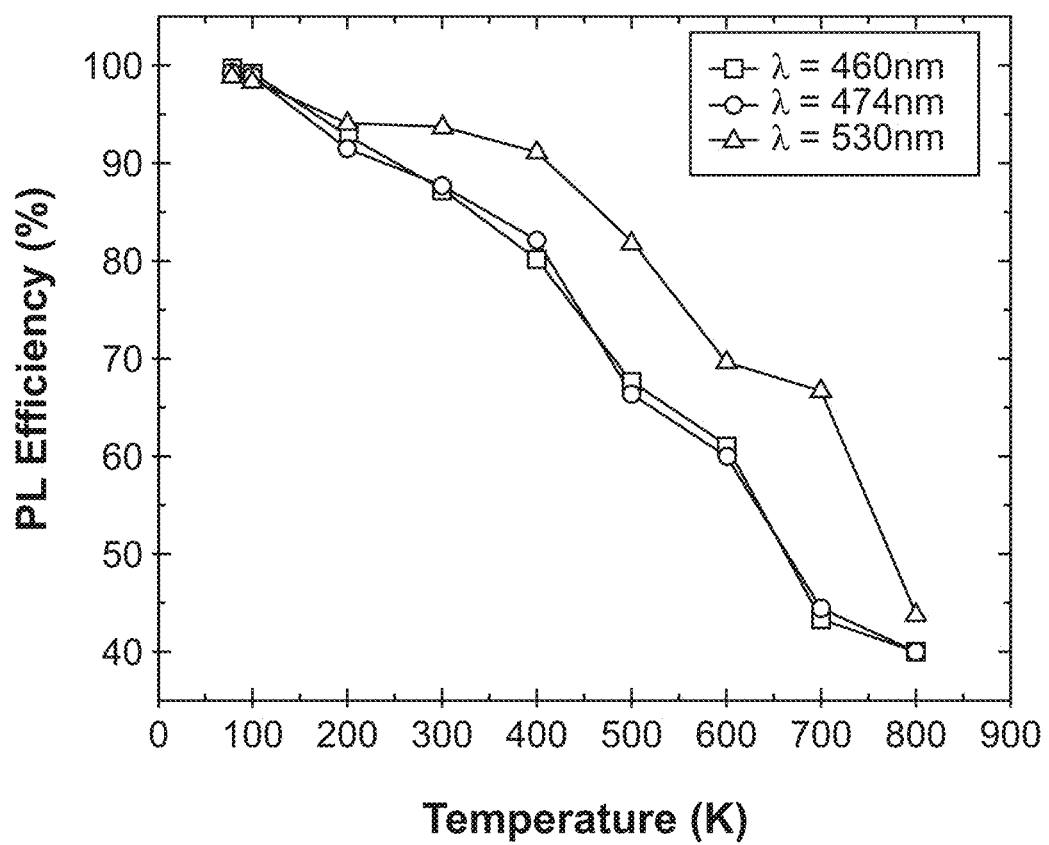
FIG. 2 shows the PL peak efficiency of different samples are plotted as a function of temperature.
Figure 3:
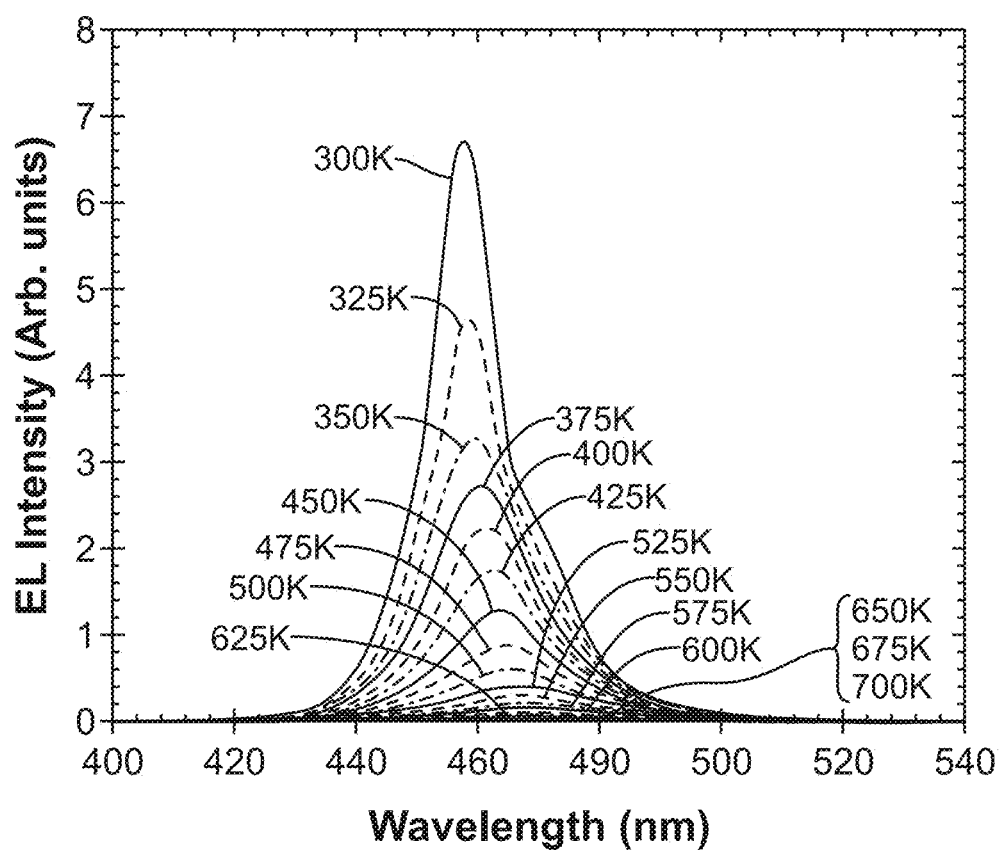
FIG. 3 shows the Electroluminescence spectra of sample 0101 LED measured at different temperatures.
Figure 4:
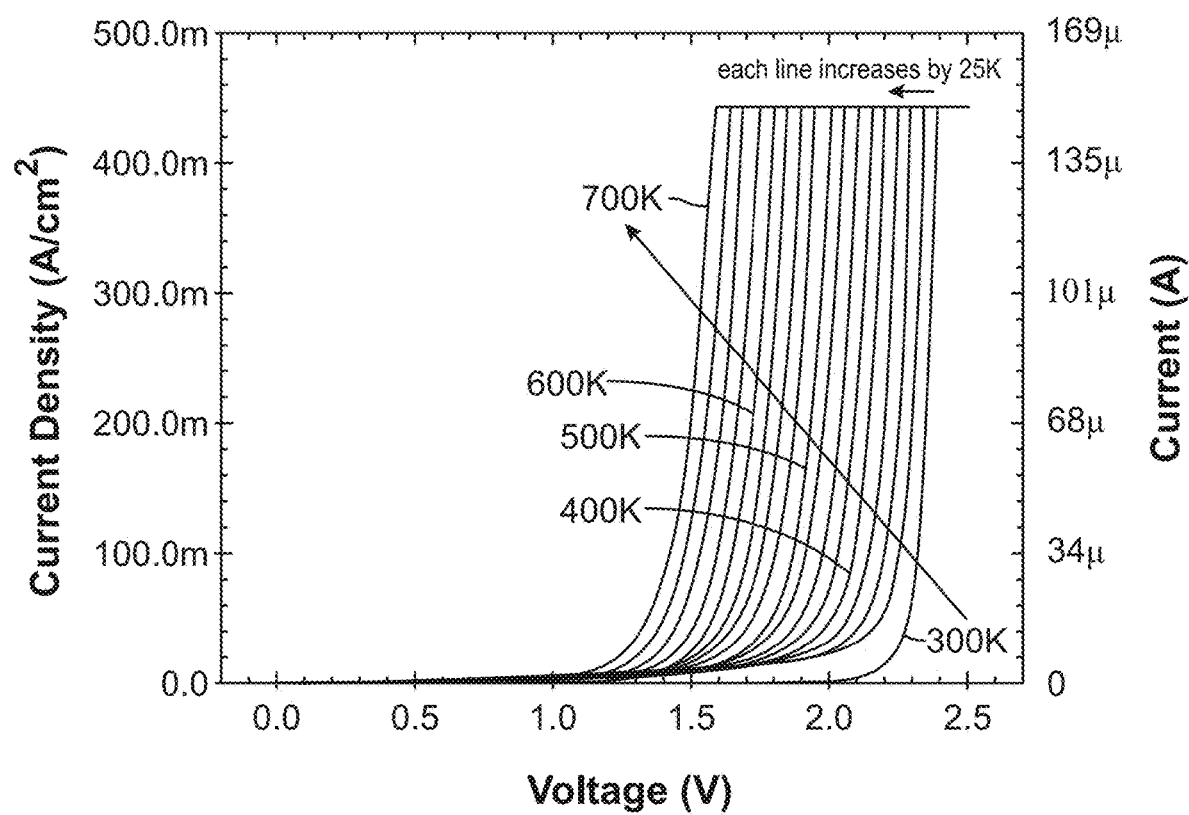
FIG. 4 shows the I-V characteristics of sample 0101 LED measured at different temperatures.

The internal quantum efficiency measurement of four wide bandgap based materials was conducted by widely accepted power law relation technique. FIG. 2 shows the internal quantum efficiency of different material as a function of temperature. The initial measurements show that the group III—nitride based materials are stable at temperatures as high as 550° C. Different commercially available LED devices were subjected to high temperature electrical and optical study to understand the degradation process on different material based LEDs. FIG. 3 shows the electroluminescence spectra of a GaN based LED at an injection current of 1 mA. The reduced intensity at high temperature is due to the domination of the non-radiative recombination. The IV characteristics of the sample is shown in FIG. 4. These results suggest that the device can operate at high temperature without failure. Photodetectors based on silicon, silicon carbide and other commercially available materials were also studied at high temperatures. The spectral response (FIG. 2) and noise analysis study reveals that the devices are functionally active at temperatures up to 250° C.

Figure 5:
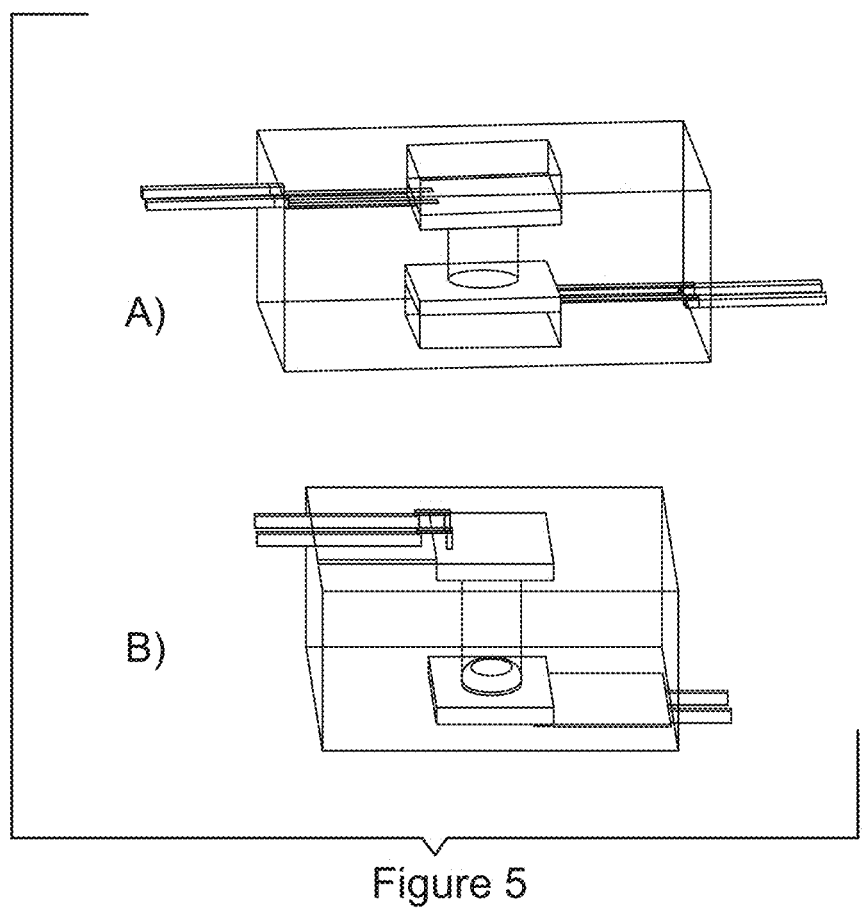
FIG. 5 shows the Solidworks models of A) LTCC based optocoupler package and B) Silicon based optocoupler package.

A detailed study on the packaging options for the high temperature optocouplers were completed along with investigating commercially available packaging architectures. The main factors to focus on were the packaging material, spacing between the discrete devices, dielectric material used in the packaging and the orientation of discrete devices. Two options for a substrate material were considered for the new package, silicon and LTCC. FIG. 5 shows the initial design options for the novel optocoupler, silicon and LTCC based packaging. LTCC not only has enhanced thermal properties but also has strong electrical isolation properties. These two properties combined also help guarantee reliability of the materials in the package. Two designs were developed to demonstrate the feasibility of the packaging technique and to develop the proper fabrication processes for such packing architectures. The LTCC fabrication facility and the staff at HiDEC assisted in the fabrication of the LTCC using conventional LTCC processing. Custom equipment attachments and optimized assembly processes were essential for reliable sample fabrication. By utilizing minimal design requirements for LTCC in Design 1, the sample was able to package an LED with dimensions of 0.35 mm by 0.47 mm. Design 2 resulted from a desire to test multiple sized photodetectors.

Figure 6:
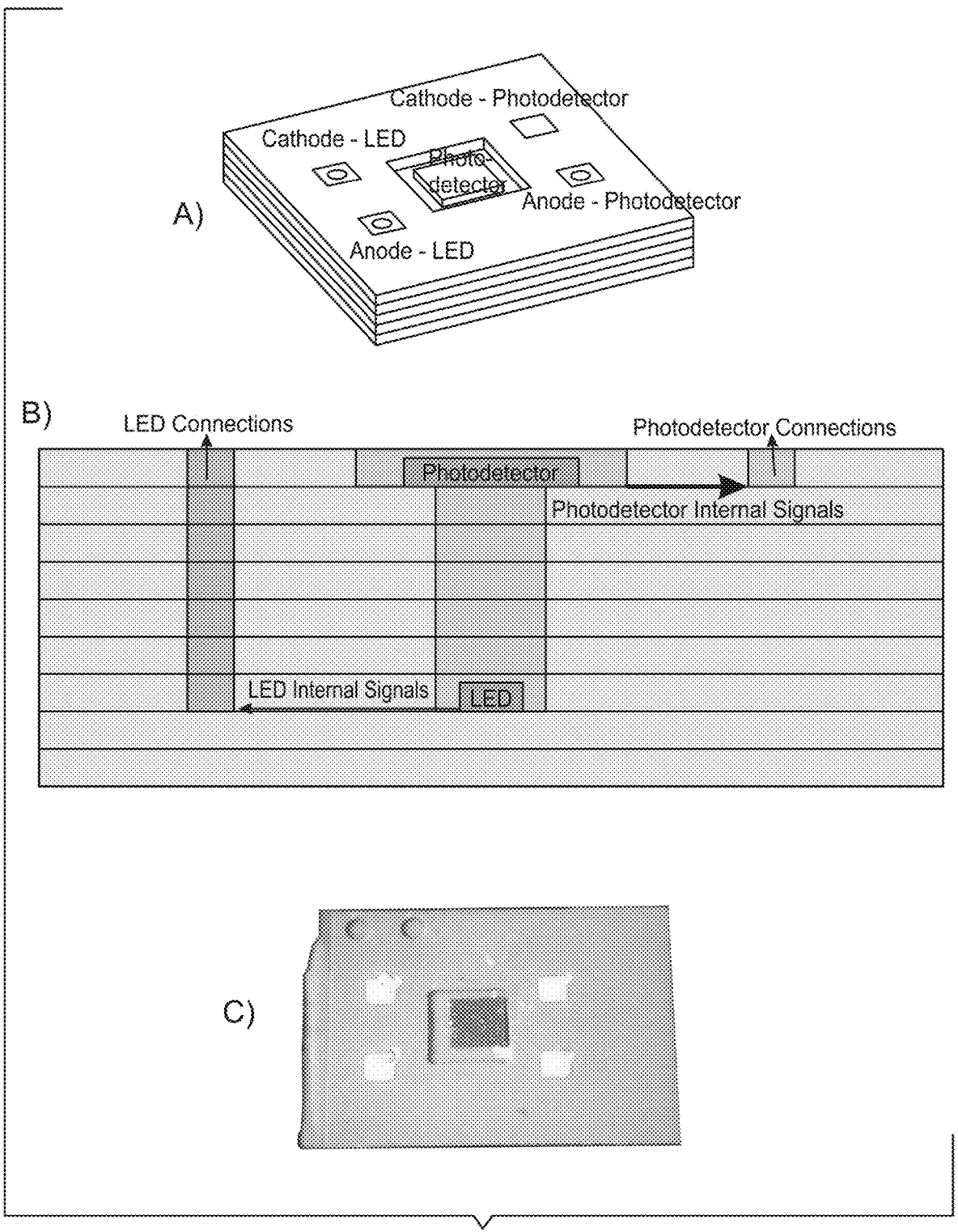
FIG. 6 shows Design 1; A) isometric view of a Solidworks model used to design the package, B) cross-section view of Solidworks model, C) fabricated sample.
Figure 7:
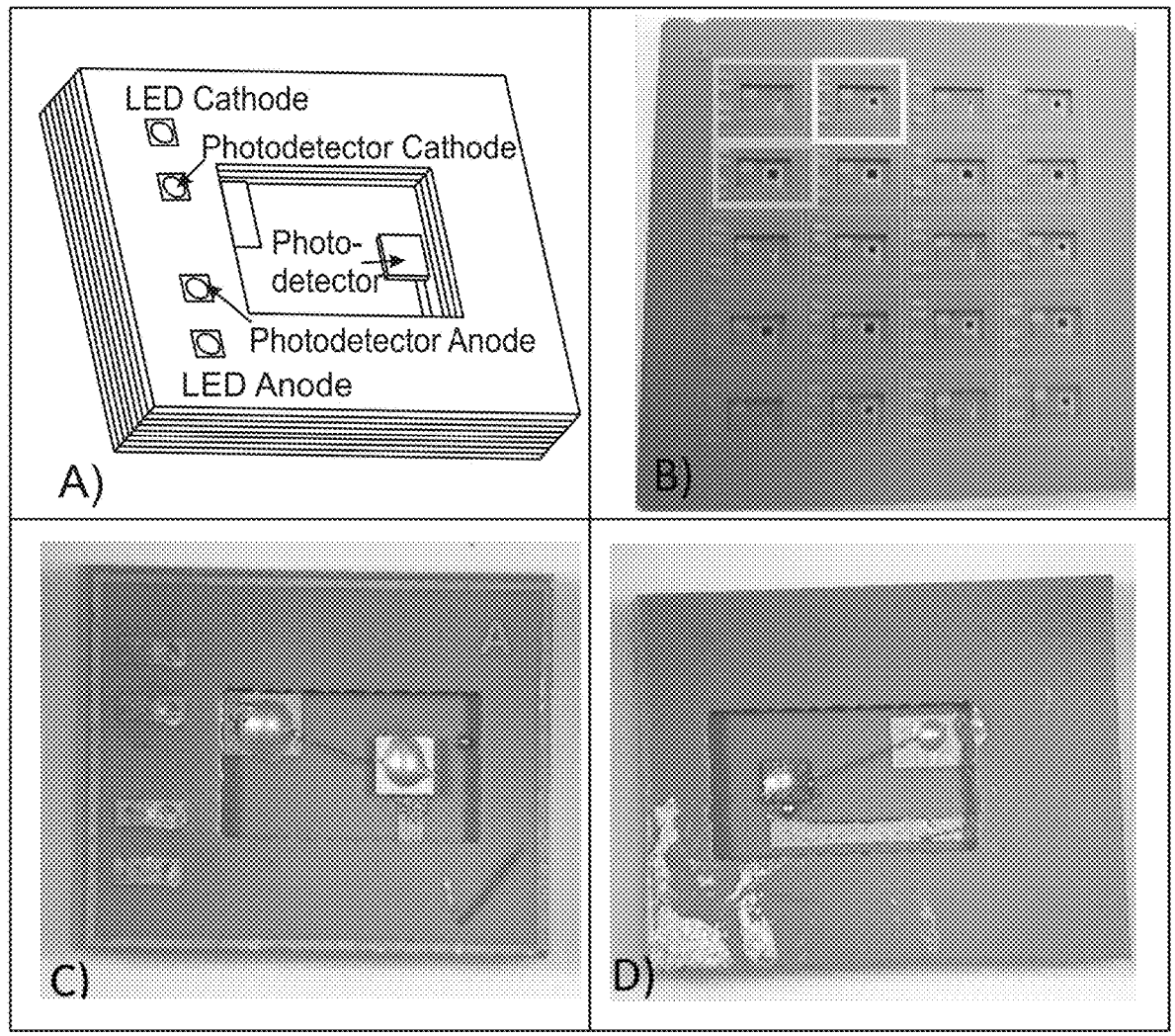
FIG. 7 shows Design 2; A) Isometric view of Solidworks model, B) Fabricated LTCC panel, small photodetector sample in the first upper left $1^{st}$ row $1^{st}$ column, medium photodetector sample $1^{st}$ row $2^{nd}$ column, large photodetector sample $2^{nd}$ row $1^{st}$ column, C) top side of fabricated sample with connections and photodetector attached, D) bottom side of fabricated sample with LED attached.

Design 1 was constructed so that the LED would fit into a cavity inside the optoelectrical isolator. The larger photodetector would be attached upside down to face the LED inside the cavity to capture the light being emitted. Internal traces of the LTCC would route the bottom side connections of the LED and the front side connections of the photodetector to the top of the package. Back side connections of the photodetector are connected via wire attach. FIG. 6 shows Design 1; A) isometric view of a Solidworks model used to design the package, B) cross-section view of Solidworks model, C) fabricated sample. The second design iteration utilized a hole through the LTCC rather than a cavity, but implementing the same technique of internal traces to route the front side connections of the device. Any backside connections are connected through wire attachment. FIG. 7 shows Design 2; A) isometric view of a Solidworks model used to design the package, B) cross-section view of Solidworks model, C) fabricated sample. Three versions of Design 2 were made implementing three different sizes of photo detectors; 0.96 mm×0.96 mm, 1.33 mm×1.33 mm, and 1.93 mm×1.93 mm.

Figure 8:
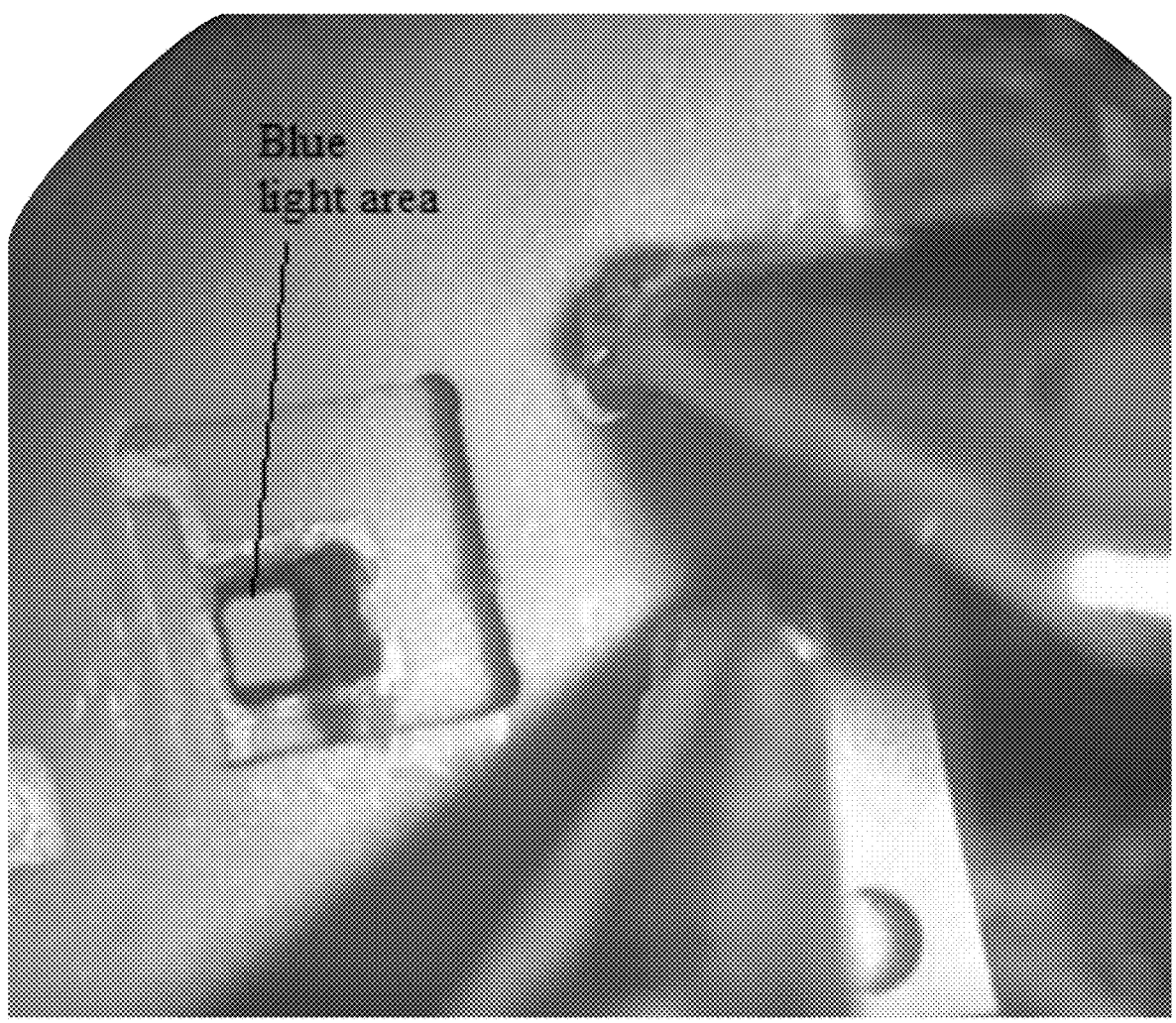
FIG. 8 shows Design 1 with LED in LTCC cavity shining bright blue with a multimeter diode test.

Preliminary testing has been performed for functionality. FIG. 8 shows Design 1 without the photodetector, you can clearly see the LED shining blue in the blue light area using a simple diode test with a multi-meter. Whole packages of Design 1 and 2 have been fabricated. Functionality testing consists of measuring the I-V characteristics of each component to guarantee devices are operating normally. Then input voltage is supplied to the LED and the output response of the photodetector is measured. Further testing in an application circuit will be used to confirm functionality at an application level.

Additional High Temperature Device Characterization

Figure 9:
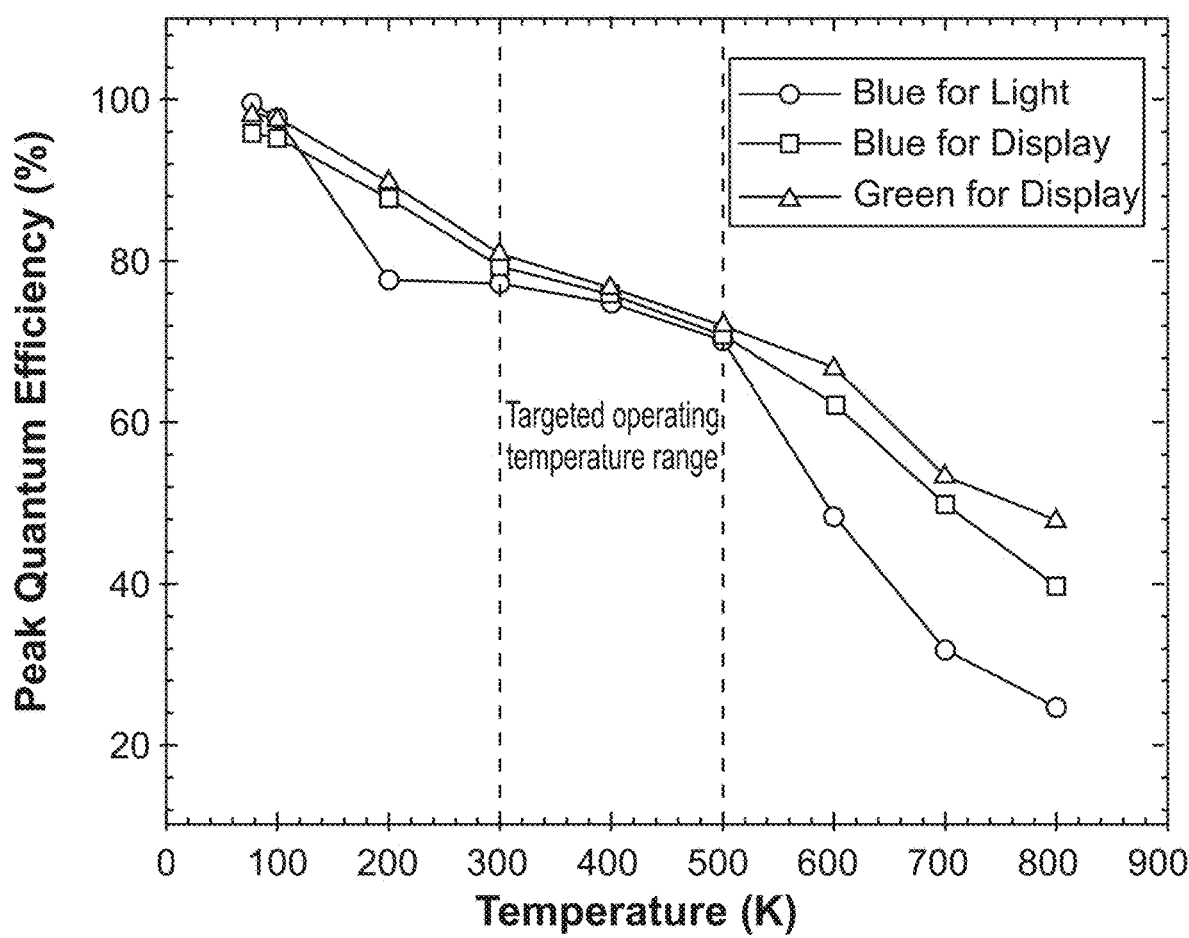
FIG. 9 shows the peak IQE of GaN-based LEDs at different temperatures as extracted and plotted.
Figure 10:
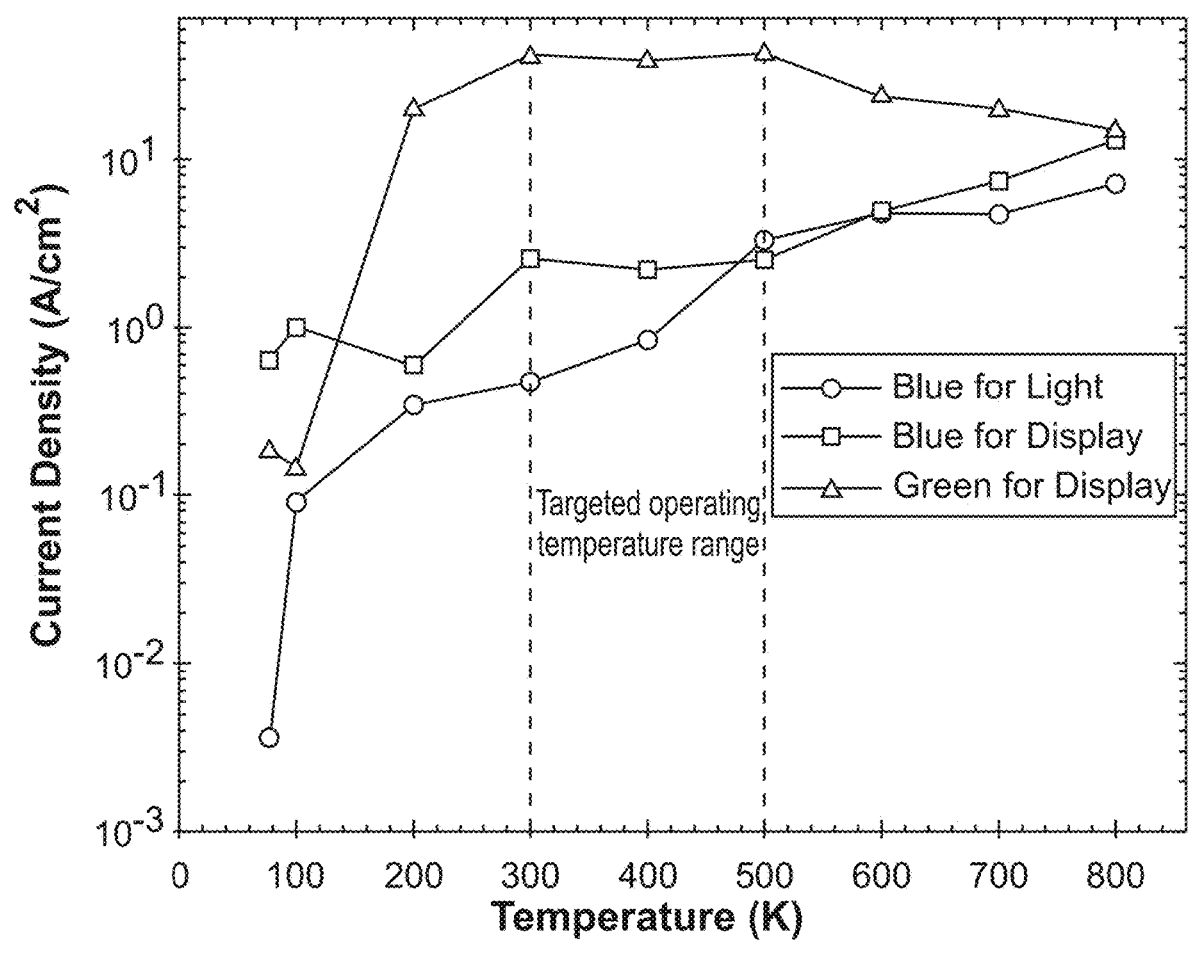
FIG. 10 shows the injection current density corresponding to the peak IQE of GaN-based LEDs at different temperatures as extracted and plotted.

Continuous operation of InGaN based LED devices without failure or flickering at temperatures up to 800 K is demonstrated. FIG. 9 shows the extracted peak internal quantum efficiency (IQE) of different LEDs (peak wavelength $\lambda p$=448 nm, 467 nm & 515 nm) from 77-800 K. Further, the study is conducted based on the biasing conditions of the devices to achieve minimum deviation in IQE over a broad temperature range. The biasing current for LED devices to achieve peak IQE is extracted and shown in FIG. 10 as a function of temperature. This data will help determine the suitable operating current of a device subjected to work at an elevated temperature without failure.

Silicon-based photodetector exhibits spectral response from visible range to the near-infrared region in the spectrum. However, the high-temperature operation of the Si-based detector is not promising based on the reported results. Commercially available silicon carbide photodetector is proven to be operated at an elevated temperature up to 450 K. Also, research-based on silicon carbide photodetectors show much higher operating temperatures. However, pairing a SiC detector with high-temperature capable and high brightness InGaN based LEDs are not viable due to wavelength mismatch. Therefore InGaN based LEDs are used as a photodetector in the high-temperature optocoupler. Also, the photoresponse of InGaN LEDs is characterized up to 800 K.

High Temperature Optocoupler—Initial Testing Results

Figure 11:
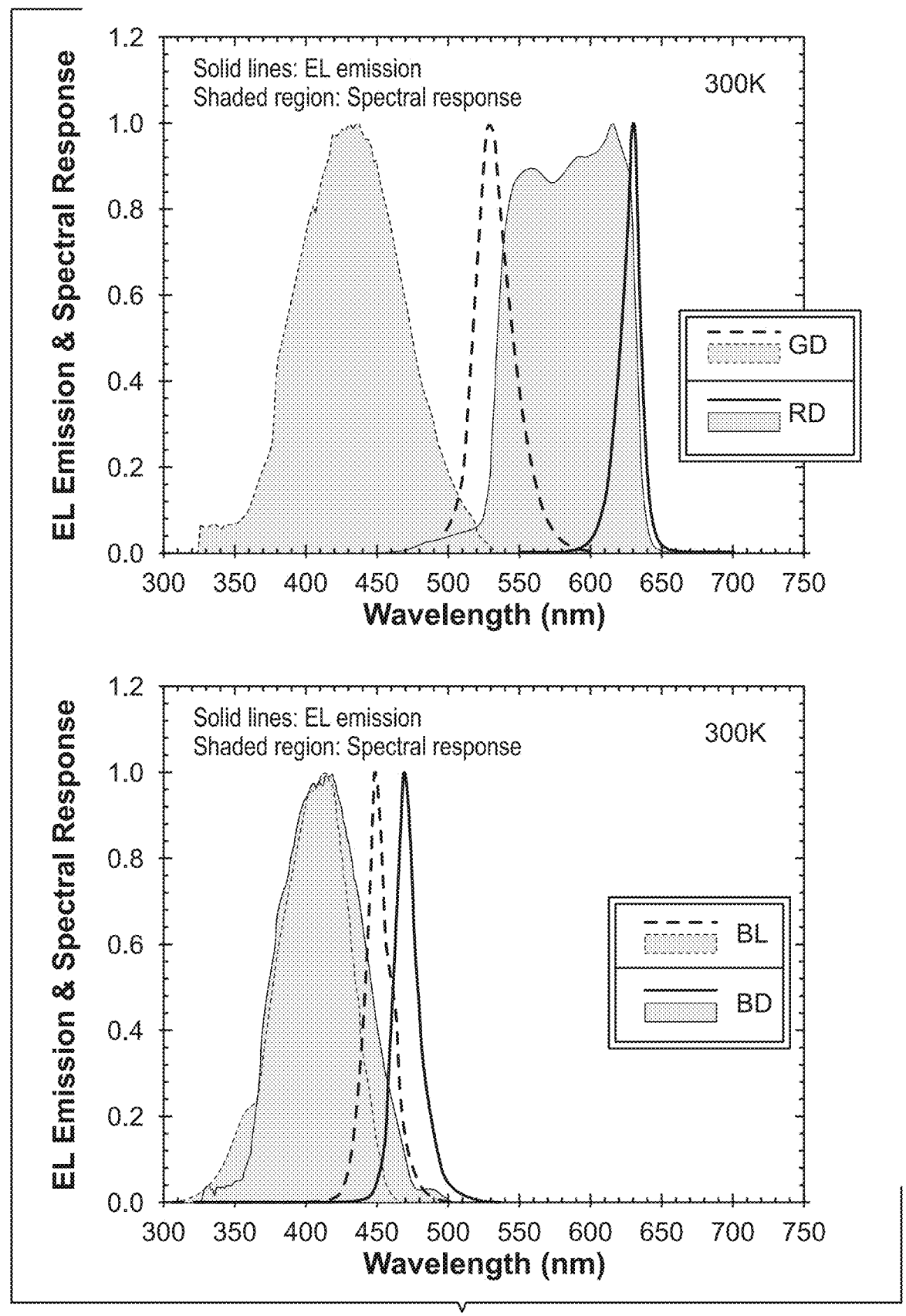
FIG. 11 shows the EL emission and spectral response of different LEDs at room temperature.
Figure 12:
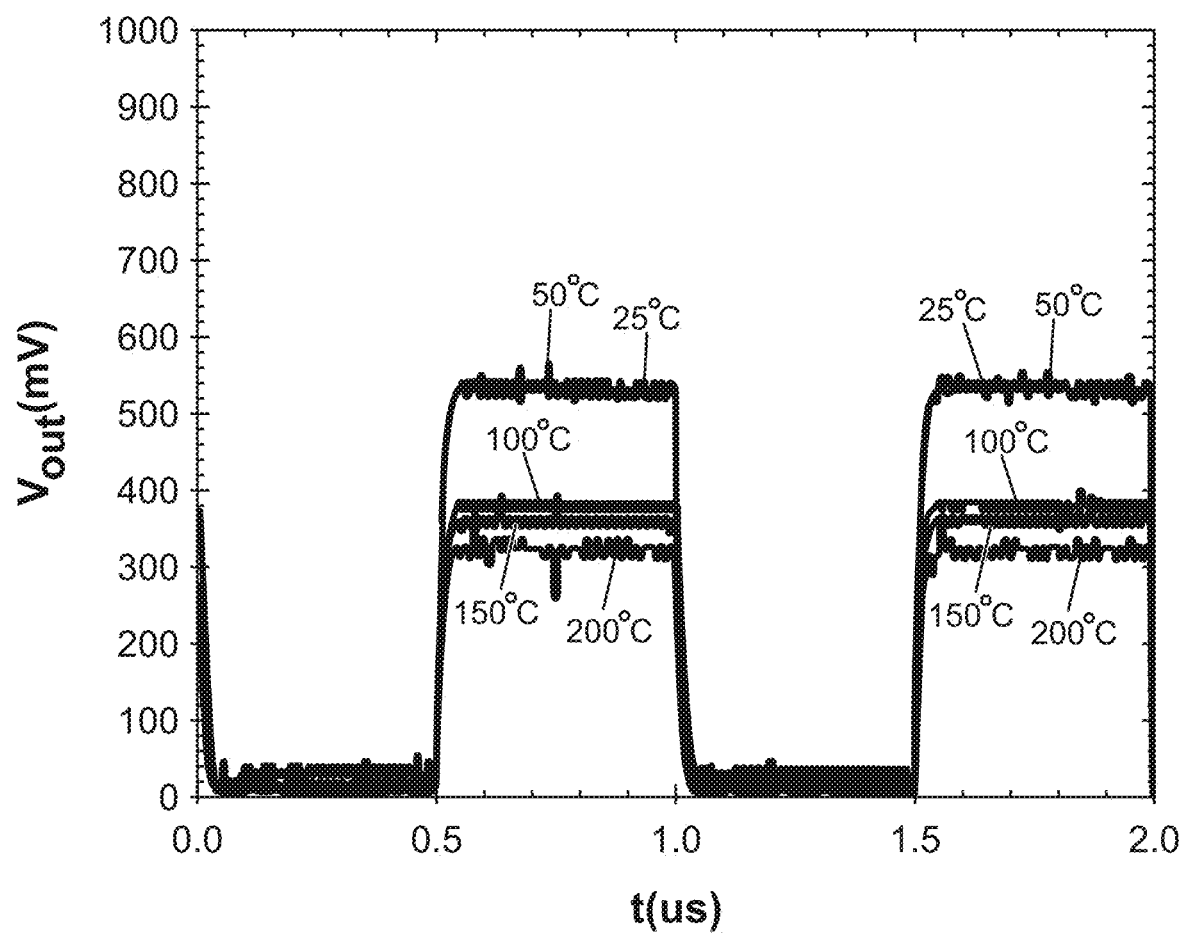
FIG. 12 shows the LTCC based optocoupler function testing at elevated temperatures with the insert showing the fabricated high temperature optocoupler.

The high-temperature LTCC optocoupler packages discrete devices, LEDs and photodiodes, selected such a way it satisfies the wavelength matching conditions. FIG. 11 shows the wavelength selection criteria; i.e., the photoresponse spectrum should cover the EL emission from the LED. Initial testing was conducted on the packaged devices up to 473 K (200° C.). FIG. 12 shows the test results from the optocoupler packaging InGaN based LEDs as emitter and detector. The insert shows the picture of fabricated high temperature optocoupler based on LTCC package.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. An optoelectronic isolator suitable for operation above two hundred and fifty degrees Celcius, comprising:
   a low temperature co-fired ceramic housing defining an enclosed package with a top and an internal light passageway inside the low temperature co-fired ceramic housing;
   a light emitting diode with bottom only connections, the light emitting diode mounted inside the low temperature co-fired ceramic housing and emitting light into the internal light passageway;
   a photodetector with front only connections, the photodetector mounted inside the low temperature co-fired ceramic housing and receiving light from the internal light passageway;
   internal traces mounted in the low temperature co-fired ceramic housing routing both the bottom side connections of the light emitting diode and the front side connections of the photodetector to the top.

2. The optoelectronic isolator of claim 1, further comprising:
   the light emitting diode includes an indium-gallium-nitride based light emitting diode; and
   the photodetector includes an indium-gallium-nitride based light emitting diode.

3. An optoelectronic isolator suitable for operation above two hundred and fifty degrees Celcius, comprising:
   a low temperature co-fired ceramic housing defining an enclosed package with an internal light emitting diode positioned adjacent an internal cavity also positioned in detecting proximity to an internal photodetector including an indium-gallium-nitride based light emitting diode.

4. An optoelectronic isolator suitable for operation above two hundred and fifty degrees Celcius, comprising:
   a low temperature co-fired ceramic housing defining an enclosed package with an internal light emitting diode adjacent an internal hole positioned in detecting proximity to an internal photodetector including an indium-gallium-nitride based light emitting diode.

* * * * *